(12) United States Patent
Jorda et al.

(10) Patent No.: US 8,327,249 B2
(45) Date of Patent: Dec. 4, 2012

(54) SOFT ERROR RATE PROTECTION FOR MEMORIES

(75) Inventors: Michael Jorda, Mountain View, CA (US); Eric Baden, Saratoga, CA (US); Sarath Kumar Immadisetty, Banglore (IN); Jeff (John) J. Dull, San Ramon, CA (US)

(73) Assignee: Broadcom Corporation, Irvine, CA (US)

( * ) Notice: Subject to any disclaimer, the term of this patent is extended or adjusted under 35 U.S.C. 154(b) by 530 days.

(21) Appl. No.: 12/614,118

(22) Filed: Nov. 6, 2009

(65) Prior Publication Data
US 2011/0047439 A1 Feb. 24, 2011

Related U.S. Application Data

(60) Provisional application No. 61/235,599, filed on Aug. 20, 2009.

(51) Int. Cl.
*G06F 11/00* (2006.01)
(52) U.S. Cl. ........................ 714/800; 714/801; 714/805
(58) Field of Classification Search .................. 714/800, 714/801, 805
See application file for complete search history.

(56) References Cited

U.S. PATENT DOCUMENTS

| | | | | |
|---|---|---|---|---|
| 5,987,585 A * | 11/1999 | Motoyama et al. | | 712/1 |
| 6,496,900 B1 * | 12/2002 | McDonald et al. | | 711/112 |
| 7,093,190 B1 * | 8/2006 | Kuslak et al. | | 714/805 |
| 7,278,085 B1 * | 10/2007 | Weng et al. | | 714/766 |
| 7,318,183 B2 * | 1/2008 | Ito et al. | | 714/754 |
| 7,386,756 B2 * | 6/2008 | Emer et al. | | 714/6.1 |
| 2004/0030959 A1 * | 2/2004 | Quach et al. | | 714/30 |
| 2005/0149839 A1 * | 7/2005 | Dent | | 714/800 |
| 2006/0123327 A1 * | 6/2006 | Foss et al. | | 714/800 |
| 2006/0265636 A1 * | 11/2006 | Hummler | | 714/800 |
| 2008/0034270 A1 * | 2/2008 | Onishi et al. | | 714/758 |
| 2009/0024887 A1 * | 1/2009 | Kimbara et al. | | 714/722 |

* cited by examiner

*Primary Examiner* — Marc Duncan
(74) *Attorney, Agent, or Firm* — Brake Hughes Bellermann LLP

(57) ABSTRACT

Methods and apparatus for performing parity and/or ECC operations are disclosed. An example method includes determining that an opcode is being transmitted on a bus and determining if the transmitted opcode is a memory operation. In the event the transmitted opcode is a memory write operation, the example method includes calculating a parity bit for data associated with the opcode, writing the calculated parity bit to a parity table and writing the data to a memory. The example method also includes, in the event the transmitted opcode is the memory read operation, recovering data from a previously written memory, calculating a parity bit for the recovered data, recovering a previously stored parity bit for the recovered data, comparing the parity bit for the recovered data with the previously stored parity bit and, in the event the recovered data parity bit does not match the previously stored parity bit, providing an error notification.

23 Claims, 5 Drawing Sheets

SOFT ERROR RATE PROTECTION FOR MEMORIES

CROSS-REFERENCE TO RELATED APPLICATIONS

This application claims the benefit, under 35 U.S.C. §119 (e), of U.S. Provisional Patent Application Ser. No. 61/235,599, filed on Aug. 20, 2009. The disclosure of U.S. Provisional Patent Application Ser. No. 61/235,599 is incorporated by reference herein in its entirety.

TECHNICAL FIELD

This description relates to soft error protection in circuit implemented memories.

BACKGROUND

Soft-errors may occur in electronic circuitry as a result of quantum-type events. Soft-errors generally occur due to subatomic particles entering a silicon based integrated circuit (IC) and causing a disturbance in the distribution of charge (typically electrons) in the circuit. These disturbances may be a result of an intrinsically charged particle (e.g., an alpha particle resulting from radioactive decay occurring in impurities of packing materials) entering the IC. Other causes of soft errors include energetic neutrons (e.g., from cosmic rays or thermal neutrons) that undergo neutron capture (collision) with a nucleus of an atom in an IC, such as a silicon atom of the IC's substrate, or a dopant atom (such as boron) that is used to create transistors for the circuit in the substrate. Other sources of soft errors exist as well, such as energetic cosmic protons, for example.

Changes in charge distribution that result from such events can cause one or mores signal in an IC to unintentionally change from a digital 1 to a digital 0, or vice versa. Such changes in a signal may be termed "soft-errors" as the errors are generally transient and the affected IC will continue to operate normally after the effects of the "soft-error event" have dissipated, such as by resetting the disrupted signal to its original value, for example.

Memories implemented in integrated circuits (e.g., static random access memories, ternary content addressable memories, etc.) are particularly susceptible to soft-errors due to the density of such circuits as well as the relatively small dimensions of transistors used in such circuits as compared with the density and device sizes of transistors used in dynamic circuitry. For instance, transistors used in dynamic circuitry are typically much larger than transistors used in memories and less densely arranged, and therefore, are less susceptible to soft-errors as the amount of charge needed to change such signals may be orders of magnitude higher than the amount of charge required to change signals in memory circuits (such as in a single memory cell).

Parity and error code correction codes (ECC) are two techniques that may be used to protect memories from the effects of soft-errors. Parity is determined by counting the number of bits in a memory entry that are set to logic 1. For even parity, the parity bit is set to a logic 1 or logic 0 so that the total number of ones in the memory entry plus the parity bit is an even number. For odd parity, the parity bit is set to a logic 1 or logic 0 so that the total number of ones in the memory entry plus the parity bit is an odd number. If a soft-error occurs in a bit of such a memory entry, the parity bit will be incorrect and the error may be reported to software and/or hardware for appropriate error handling. Parity bits are stored in a memory along with the data that they are associated with.

Error correction codes are a set of encoded bits that are generated by encoding data stored in a particular memory location. The data for each entry of a memory structure may be encoded using an array of logic gates, for example. The error correction codes can then be used, on subsequent accesses to the data, to determine if a soft-error has occurred. The error correction codes can also be used to reconstruct the original data and repair the soft-error. As with parity bits, ECC bits are stored in a memory along with the data that they are associated with.

While parity and ECC are an effective way to detect, and/or detect and correct soft-errors in random access memories, implementing such approaches in certain memory structures may be complex and expensive. For instance, implementing parity or ECC in a ternary content addressable memory (TCAM), so that parity and ECC operations are done during compare operations (memory accesses) would require a parity or ECC protection circuit per TCAM entry. Such an approach would be extremely complex to design and would result in significant increases in the size of such memories on a silicon chip, thus significantly increasing the design complexity, development costs and manufacturing costs of such devices.

SUMMARY

A method and/or apparatus for soft-error protection for data memories, substantially as shown in and/or described in connection with at least one of the figures, as set forth more completely in the claims.

DETAILED DESCRIPTION

Figure 1:
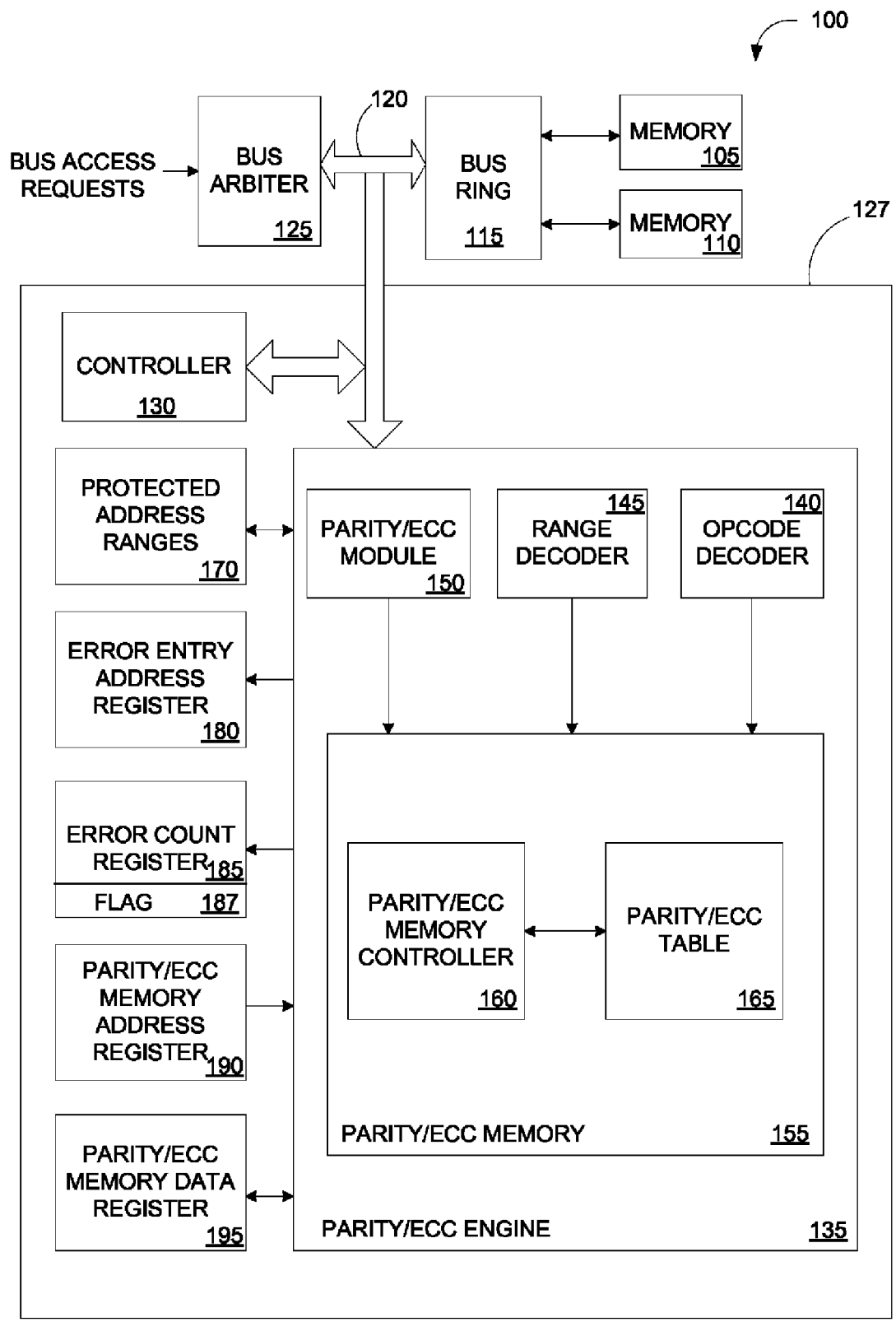
FIG. 1 is a block diagram illustrating an example embodiment of a soft-error protection circuit.

FIG. 1 is a system 100 that may be used to implement embodiments of parity/ECC protection for memories in integrated circuit (IC) devices. For instance, the techniques described herein may be implemented in a network device that uses ternary content addressable memory (TCAM) structures, as well as other types of content addressable and non-content addressable memories. It will be appreciated that the techniques described herein can be applied in ICs and/or systems that store and/or access data stored in one or more memory structures (e.g., circuit based memory structures). The techniques described herein, however, are not limited to application in any particular type of device and/or system. As used herein, the term system may refer to a single IC or may refer to a collection of components that includes a plurality of ICs.

The system 100 shown in FIG. 1 includes a plurality of data memories that may include a memory 105 and a memory 110. The memories 105 and 110 may take the form of a number of different types of memory structures, such as TCAMs, static random access memories (SRAMs), or other types of memories that are circuit based and used for storing digital information or data. The memories 105 and 110 are coupled with a bus ring 115 that is used to access the memories 105 and 110 to perform memory write operations and memory read operations. The bus ring 115 is further coupled with a bus 120. In the system 100, the bus 120 may be used to communicate operation codes (opcodes), such as opcodes for memory write and memory read operations, as well as other types of operations.

The system 100 also includes a bus arbiter 125 that may be used to receive bus access requests and place the received bus access requests onto the bus 120 in the form of opcodes, for example. Such bus access requests may include opcodes for memory write operations, opcodes for memory read operations and opcodes for other types of operations, such as packet processing operations in a network device, for example. The bus arbiter 125 may place the bus access requests onto the bus 120 in accordance with an appropriate bus protocol in order to control data traffic on the bus 120.

The system 100 also includes a soft-error rate (SER) protection circuit 127 that may be used to perform parity and/or error correction code (ECC) operations for memory operations that are communicated over the bus 120 for the memories 105 and 110 (as well as any additional memories included in the system 100). In other embodiments, opcodes for memory operations may be communicated in other fashions.

The system 100 also includes a controller 130 that is coupled with the bus 120. The controller 130 may be configured to monitor the bus 120 and capture operation codes (opcodes) that are transmitted over the bus 120. The controller 130 may also be configured to communicate captured opcodes to a parity/ECC engine 135 of the system 100. For example, the controller 130 may be configured to monitor data traffic on the bus 120 and recognize specific bit patterns that indicate an opcode is being communicated onto the bus 120 by the bus arbiter 125. The controller 130 may then capture those opcodes (e.g., prevent them from being directly communicated onto the bus ring 115) for processing by the parity/ECC engine 135 before communicating the opcodes to the bus ring 115. It will be appreciated that a particular embodiment may include a parity/ECC engine 135 that is configured to perform both parity and ECC operations. In other embodiments, the system 100 may include only a parity engine 135 or only an ECC engine 135. In such embodiments (i.e., including a parity engine 135 or an ECC engine 135), the system 100 would be configured to perform either parity operations only or ECC operations only, depending on the type of protection engine implemented in the particular embodiment.

The parity/ECC engine 135 of the system 100 includes an opcode decoder 140 that is operationally coupled with the controller 130. The opcode decoder 140 is configured to receive the captured opcode from the controller 130 and examine the opcode to determine the type of opcode that has been captured by and received from the controller 130. For instance, the opcode decoder 130 may examine the bit pattern of the captured opcode to determine if the opcode is a memory operation, such as a memory write or memory read operation.

One approach for examining the bit pattern of the opcode may be comparing the opcode with a table (e.g., a lookup table) of available opcodes for the system 100. Such a table may include an entry for each opcode, where each entry includes an indication if the corresponding opcode is a memory operation (e.g., a memory read or memory write operation). If a captured opcode is determined to be a memory write operation or a memory read operation (such as by matching an entry in an opcode table), the opcode decoder 140 may then provide an indication to the controller 130 and/or the parity/ECC engine 135 that the opcode is a memory operation.

As one alternative, the opcode decoder 140 may include a table that only includes opcodes for memory operations. In such an approach, if a captured opcode does not match one of the entries in the table, the opcode decoder 140 may provide the controller 130 with an indication that the captured opcode is not a memory operation.

Depending on the particular embodiment, the parity/ECC engine 135 may perform a parity or ECC operation for every opcode that is identified as a memory access operation (write or read) by the opcode decoder 140. Alternatively, the parity/ECC engine 135 may only perform parity or ECC operations for memory access operations that are associated with a protected address range for the system 100. In such an approach, a captured opcode that has been identified as a memory operation by the opcode decoder 140 may be communicated to a range decoder 145. The range decoder 145 may further examine the captured opcode to determine a memory address that is associated with the memory operation (e.g., the address of a memory location that is to be read or written in accordance with the opcode). The range decoder 145 may then determine if the address of the memory location associated with the opcode falls within one or more protected address ranges that have been defined (e.g., defined by a user) for the system 100.

For instance, in the system 100, a table of protected memory address ranges may be stored in a protected address range table 170. Alternatively, such a table of protected memory address ranges could be stored within the range decoder 145, or using a number of other approaches, such as storing the protected address ranges in the controller 130, for example. Depending on the particular embodiment, the table of protected address ranges 170 may identify the protected address ranges in a number of ways. For instance, the protected address ranges may be listed in the table 170 in accordance with a memory map for the system 100, where each address range (both protected and unprotected ranges) is defined using an address range designator (e.g., Range 0, Range 1 . . . Range X), a start address for the range and an end address range. The table of address ranges 170 may also include, for each address range, an indication whether memory operations for the particular range are to be parity or ECC protected operations.

For instance, if a particular address range is indicated in the protected address range table 170 as being a protected address (i.e., it falls within one of the protected address ranges), then the range decoder 145 will notify the controller 130 and/or a parity/ECC module 150 of the parity/ECC engine 135 that memory operations (memory reads or writes) associated with that address range are to be conducted as a parity or ECC protected operations. Example approaches for such parity and ECC protected operations are described in further detail below.

If, however, a particular address range is indicated in the protected address range table 170 as not being a protected address range, then the range decoder 145 will notify the controller 130 and/or the parity/ECC module 150 that memory operations (memory reads or writes) associated with that address range are to be conducted as a non-parity or non-ECC operations. In such a situation, the controller 130, in response such a notification, may issue a corresponding memory operation to the bus ring 115 (via the bus 120) for execution without a parity or ECC operation being performed by the SER protection circuit 127.

In the system 100, opcodes for memory operations may be received by bus arbiter 125 as bus access requests from a number of sources. For instance, memory operations may be received as a remote memory access instruction, a software memory access instruction or a hardware memory access instruction. Each of these types of memory access instructions may be processed by the SER protection circuit 127 in the fashions described herein.

The parity/ECC engine 135 of the SER protection circuit 127 shown in FIG. 1 also includes a parity/ECC module 150 and a parity/ECC memory 155. In like fashion as discussed above, the parity/ECC module 150 and the parity/ECC memory 155 may operate as both a parity module/memory and an ECC module/memory. Alternatively, the parity/ECC module 150 and the parity/ECC memory 155 may operate only as a parity module/memory or may operate only as an ECC module/memory.

For the purposes of illustration, the parity/ECC module 150 and parity/ECC memory 155 will first be described as operating as a parity module 150 and a parity memory 155, and then will be described as operating as an ECC module 150 and an ECC memory 155. It will, however, be appreciated that both parity and ECC functions may be implemented by the parity/ECC module 150 and the parity/ECC memory 155 in the system 100. For instance, when both parity and ECC operations are supported, the protected address range table 170 may, for each protected address range, include an indication of whether parity protection or ECC protection is to be used for that address range.

The parity/ECC module 150 and the parity/ECC memory 155 will now be described as being configured to operate only as a parity module 150 and a parity memory 155. In such an embodiment, the opcode decoder 140 may identify a captured opcode as a memory (write or read) operation. In the event the captured opcode is identified as a memory write operation, the opcode decoder 140 may inform the controller 130 and/or the range decoder 145 that the captured opcode is a memory write operation. The range decoder 145 may then determine whether a memory address associated with the captured opcode falls within a protected address range, such as comparing the address associated with the captured opcode with the protected address range table 170, or using another appropriate technique.

In other embodiments, all memory operations may be conducted as parity operations. In such an approach, there would be no need to determine if an address associated with the captured opcode is in a protected address range, because all memory address locations would be parity protected.

Once the captured opcode is identified as a memory write operation and a determination is made (if appropriate) that the address associated with the memory write operation is in a protected address range, the captured opcode may be communicated to the parity module 150 (e.g., from the controller 130, from the opcode decoder 140 and/or from the range decoder 145). After receiving the captured opcode, the parity module 150 may calculate a parity bit for the data to be written that is included in the memory write opcode. For instance, the parity module 150 may calculate an even parity bit for the data to be written. Alternatively, the parity module 150 may calculate an odd parity bit for the data to be written. It is noted that, in a specific embodiment, the parity module 150 would consistently use either even parity or odd parity for calculating parity bits for data entries associated with memory operations.

After the parity module 150 calculates the parity bit (e.g., even or odd parity), the parity module 150 may instruct a parity memory controller 160 included in the parity memory 150 to write the calculated parity bit to a parity table 165 also included in the parity memory 155. The parity table 165 may be implemented, for example, in a SRAM or other appropriate memory structure. The parity memory controller 160 may determine a parity bit address in the parity table 165 that is based on the memory address associated with the captured opcode. Such an approach is described in further detail below with respect to FIG. 5. Other approaches for determining a parity address for storing the calculated parity bit in the parity table 165 are possible. For instance, such parity bit addresses may be determined using any appropriate memory mapping technique.

Once the calculated parity bit has been written to the parity table 165 (or in parallel with writing the calculated parity bit), the controller 130 may issue the captured opcode for the memory write operation to the bus 120. Once the controller 130 issues the captured opcode to the bus 120, the captured opcode may be communicated to the bus ring 115 so that the memory write operation may be completed in the system 100, e.g., by writing the data associated with the captured opcode to one of the memories 105 and 110, or another memory that may be included in the system 100.

In the system 100, where the parity/ECC module 150 and the parity/ECC memory 155 are configured to operate only as a parity module 150 and a parity memory 155, the opcode decoder 140 may receive a captured opcode from the controller 130 and determine that the captured opcode is a memory read operation. In like fashion as previously discussed, the address associated with the memory read operation may be determined to be in a protected address range (e.g., by the range decoder 145), or the system 100 may be configured to conduct all memory operations as parity operations. In these situations, the opcode decoder 140 and/or the range decoder 145 may inform the controller 130 that the captured opcode is a memory read operation with parity protection.

In response, the controller 130 may issue the memory read operation to the bus 120 so that the memory read operation can be executed by the system 100. When the data associated with the memory read operation is returned to the bus 120, the controller 130 may capture this data and provided the returned data to the parity module 150.

The parity module 150 may then calculate a parity bit for the returned data associated with the memory read operation. Additionally, the parity module 150 may request that a previously stored parity bit (e.g., a parity bit written using the technique described above) for the data associated with the memory read operation be retrieved from the parity table 165 via the parity memory controller 160. After receiving the previously calculated parity bit from the parity memory 155, the parity module 150 may compare the calculated parity bit for the data associated with the memory read operation with the previously stored and retrieved parity bit. If the two parity bits match, this indicates that an error (e.g., soft-error) has not occurred in the data during the time it was stored in the system 100. The parity module 155 may then inform the controller 130 that parity matched, indicating no error in the data, and the controller 130 may issue the retrieved data onto the bus 120, so that the retrieved data can be provided (e.g., via the bus arbiter 125) in response to the memory read operation for which the data was retrieved, whether it be a remote memory read instruction, a software memory read instruction or a hardware memory read instruction.

If, however, the calculated parity bit for the data associated with the memory read operation and the previously stored parity bit for the data associated with the memory read operation do not match, the parity module 150 may indicate to the parity engine 135 and or the controller 130 that a parity error has occurred. In the event a parity error is identified, the parity engine 135 and/or the controller 130 may provide at least one of a hardware parity error notification and a software parity error notification.

In the case of a hardware parity notification, the parity engine 135 may write the address of the memory location for which the parity error occurred to an error entry address register 170 that is coupled with the parity engine 135. Also, the parity engine 135 may increment an error count in an error count register 185 as well as set a hardware error flag 187 included in the error count register. The hardware error flag 187 may indicate to a processor (not shown) of the system 100 that a parity error has occurred in the system 100. In response to the error flag 187 being set, the processor may read the error entry address register 180 and the error count register 185. The processor may then determine an appropriate response to the parity error based on the address stored in the error entry address register 180 and the value stored in the error count register 185. Depending on the particular embodiment, the error entry address register 180 and the error count register 185 may be clear-on-read registers. Specifically, in such an approach, the registers 180 and 185 are reset as a result of their values being read by the CPU.

Further, depending on the particular embodiment, multiple parity errors may occur before a processor reads the error entry address register 180 and the error count register 185. In such approaches, the error entry address register 180 only the address of the last memory location to experience a parity error. Alternatively, the error entry address register may include multiple entries that operate on a first-in-first-out (FIFO). For example, if the error entry address register 180 includes five address entries, the error address register 180 may contain (up to) the last five address that experienced a parity error.

Alternatively, an indication of a parity error may be provided via a negative software acknowledgment rather than providing a hardware notification via the registers 180 and 185. In such an approach, the SER protection circuit 127 would provide a negative software acknowledgement via the bus 120 and the bus arbiter 125 in response to a software memory read instruction.

The parity/ECC module 150 and the parity/ECC memory 155 will now be described as being configured to operate only as an ECC module 150 and an ECC memory 155. In such an embodiment, the opcode decoder 140 may identify a captured opcode as a memory (write or read) operation. In the event the captured opcode is identified as a memory write operation, the opcode decoder 140 may inform the controller 130 and/or the range decoder 145 that the captured opcode is a memory write operation. The range decoder 145 may then determine whether a memory address associated with the captured opcode falls within a protected address range, such as comparing the address associated with the captured opcode with the protected address range table 170, or using another appropriate technique.

In other embodiments, all memory operations may be conducted as ECC operations. In such an approach, there would be no need to determine if an address associated with the captured opcode is in a protected address range, because all memory address locations would be ECC protected.

Once the captured opcode is identified as a memory write operation and a determination is made (if appropriate) that the address associated with the memory write operation is in a protected address range, the captured opcode may be communicated to the ECC module 150 (e.g., from the controller 130, from the opcode decoder 140 and/or from the range decoder 145). After receiving the captured opcode, the ECC module 150 may encode the data to be written that is included in the memory write opcode using an array of logic gates to produce an associated set of ECC bits for the data to be written. For instance, the ECC module 150 may encode data associated with memory write operations using any appropriate encoding approach. For instance, Reed-Solomon encoding, Turbo coding or Forward error correction coding may be used, as some examples, in the system 100.

After the ECC module 150 determine/calculates/encodes the ECC bits, the ECC module 150 may instruct an ECC memory controller 160 included in the ECC memory 150 to write the ECC bits to an ECC table 165 also included in the ECC memory 155. In like fashion as discussed above for the parity table 165, the ECC table 165 may be implemented, for example, in a SRAM or other appropriate memory structure. Also in like fashion as discussed above for the parity memory 155, the ECC memory controller 160 may determine an address for storing the ECC bits in the ECC table 165 that is based on the memory address associated with the captured opcode, as is described in further detail below with respect to FIG. 5. Other approaches for determining an address for storing the ECC bits in the ECC table 165 are also possible. For instance, such an address for storing the ECC bits may be determined using any appropriate memory mapping technique.

Once the ECC bits have been written to the ECC table 165 (or in parallel with writing the ECC bits), the controller 130 may issue the captured opcode for the memory write operation to the bus 120. Once the controller 130 issues the captured opcode to the bus 120, the captured opcode may be communicated to the bus ring 115 so that the memory write operation may be completed in the system 100, e.g., by writing the data associated with the captured opcode to one of the memories 105 and 110, or another memory that may be included in the system 100.

In the system 100, where the parity/ECC module 150 and the parity/ECC memory 155 are configured to operate only as an ECC module 150 and an ECC memory 155, the opcode decoder 140 may receive a captured opcode from the controller 130 and determine that the captured opcode is a memory read operation. In like fashion as previously discussed, the address associated with the memory read operation may be determined to be in a protected address range (e.g., by the range decoder 145), or the system 100 may be configured to conduct all memory operations as ECC operations. In these situations, the opcode decoder 140 and/or the range decoder 145 may inform the controller 130 that the captured opcode is a memory read operation with ECC protection.

In response, the controller 130 may issue the memory read operation to the bus 120 so that the memory read operation can be executed by the system 100. When the data associated with the memory read operation is returned to the bus 120, the controller 130 may capture this data and provided the returned data to the ECC module 150.

The ECC module 150 may then encode the returned data associated with the memory read operation to produce a set of ECC bits for the returned data. Additionally, the ECC module 150 may request that previously stored ECC bits (e.g., ECC bits written using the technique described above) for the data associated with the memory read operation be retrieved from the ECC table 165 via the ECC memory controller 160. After receiving the previously stored ECC bits from the ECC memory 155, the ECC module 150 may compare the ECC bits for the data associated with the memory read operation with the previously stored and retrieved ECC bits.

If the two sets of ECC bits match, this indicates that an error (e.g., soft-error) has not occurred in the data during the time it was stored in the system 100. The ECC module 155 may then inform the controller 130 that the ECC bits matched, indicating no error in the data, and the controller 130 may issue the retrieved data onto the bus 120, so that the retrieved data can be provided (e.g., via the bus arbiter 125) in response to the memory read operation for which the data was retrieved, whether it be a remote memory read instruction, a software memory read instruction or a hardware memory read instruction.

If, however, the ECC bits for the data associated with the memory read operation and the previously stored ECC bits do not match, the ECC module 150 may attempt to reconstruct the retrieved data using the previously stored ECC bits. Depending on the level of ECC encoding used, the ECC module 150 may be able to repair single bit errors, or multiple bit errors. The amount of correction possible using the ECC bits depends on the extent of encoding used to generate the ECC bits and the number of ECC bits generated for each memory location.

In the event the ECC module 150 is unable to repair the retrieved data using the previously stored ECC bits, the ECC module 150 may be configured to indicate the error in the system 100 in similar fashion as discussed above with respect to an implementation using only parity protection. For the purposes of brevity and clarity, the details regarding error reporting are not repeated again here.

Depending on the particular embodiment, the parity/ECC memory table 165 may be "directly" accessed (e.g., not through the controller 130) using a parity/ECC memory address register 190 and a parity/ECC memory data register 195. In such an embodiment, the parity/ECC memory address register 190 and the parity/ECC memory data register 195 may be configured to conduct direct memory access operations on the parity/ECC memory 155, by directly addressing the parity/ECC table 165 via the parity/ECC memory controller 160.

Figure 2:
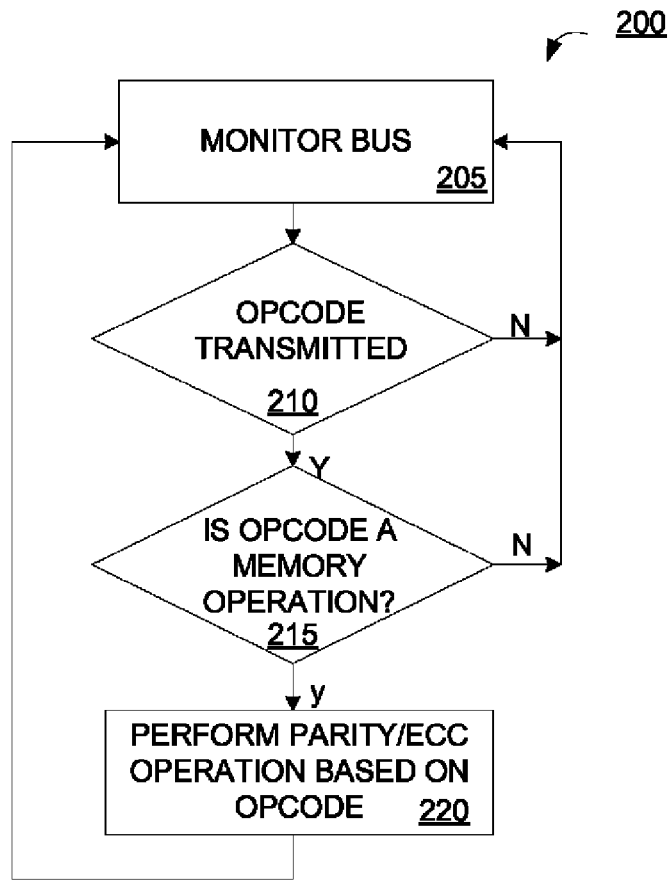
FIG. 2 is a flowchart illustrating an example method for performing a parity/ECC operation.

FIG. 2 is a flowchart illustrating an example method 200 for performing a parity/ECC operation. The method 200 may be implemented in the system 100 and will be described with further reference to FIG. 1. While the method 200 is described with particular reference to the system 100 in FIG. 1, it will be appreciated that the method 200 may be implemented in a number of other appropriate systems. For instance, the method 200 may be implemented in a system that includes fewer or additional components than the system illustrated in FIG. 1. As another alternative, the method 200 may be implemented in a system having a different arrangement or different elements than the system 100.

When implemented in the system 100 illustrated in FIG. 1, the method 200 may include, at block 205, monitoring, in an integrated circuit (IC), a bus 120 configured to communicate a plurality of operation codes (opcodes). The method 200 may also include, at block 210, determining whether an opcode of the plurality of opcodes is being transmitted on the bus, such as using the controller 130. If it is determined, at block 210, that an opcode is not being transmitted, the method 200 returns to monitoring the bus 120 at block 205.

If, however, it is determined at block 210 that an opcode is being transmitted on the bus 120, the method 200 may proceed to block 215. At block 215, it may be determined, such as by the opcode decoder 140, whether the opcode being transmitted on the bus 120 is a memory access operation (i.e., a memory read or write operation). If the opcode is determined, at block 215, to not be a memory access operation, the method 200 returns to monitoring the bus 120 at block 205.

In the event that the opcode decoder 140 determines, at block 215, that the captured opcode is a memory access operation, the method 200 proceeds to block 220. At block 220, the system 100 may perform a parity or ECC operation for a memory write operation or a memory read operation, such as in the fashions discussed above. As previously discussed, memory access operations may be remote memory access operations, software memory access operations or hardware memory access operations.

Figure 3:
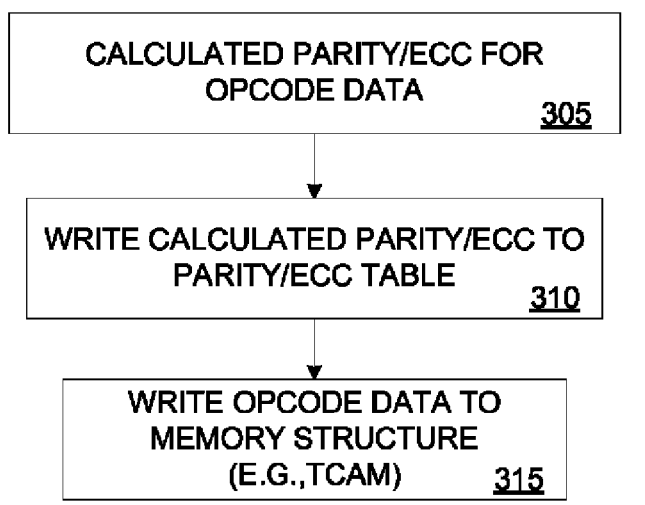
FIG. 3 is a flowchart illustrating an example method for performing a parity/ECC for a memory write operation.

FIG. 3 is a flowchart illustrating an example method 300 for performing a memory write operation. As with the method 200, the method 300 may be implemented in the system 100 and will be described with further reference to FIG. 1. While the method 300 is described with particular reference to the system 100 in FIG. 1, it will be appreciated that the method 300 may be implemented in a number of other appropriate systems. For instance, the method 300 may be implemented in a system that includes fewer or additional components than the system illustrated in FIG. 1. As another alternative, the method 300 may be implemented in a system having a different arrangement or different elements than the system 100. The method 300 may also be implemented as block 220 of the method 200 illustrated in FIG. 2 when it is determined at block 215 of the method 200 that an opcode captured by the controller 130 is a memory write operation that is a parity/ECC protected operation (e.g., either in a protected address range or in an embodiment where all memory access operations are parity/ECC protected).

The method 300 may include, at block 305, calculating a parity bit or determining ECC bits (which may also be referred to herein as calculating or encoding ECC bits) for data to be written that is associated with the transmitted opcode. The parity bit or ECC bits may be determined using the approaches discussed above, or using any appropriate technique. The method 300, at block 310, further includes writing the parity bit or the ECC bits to the parity/ECC table 165 via the parity/ECC memory controller 160 in the parity/ECC memory 155. The method 300 further includes writing the data associated with the captured opcode to one of the memories (e.g., the memory 105 or the memory 110) of the system 100. As discussed above, the data associated with the captured opcode may be written to a memory as a result of the captured opcode being issued, by the controller 130, to the bus ring 115 via the bus 120.

Figure 4:
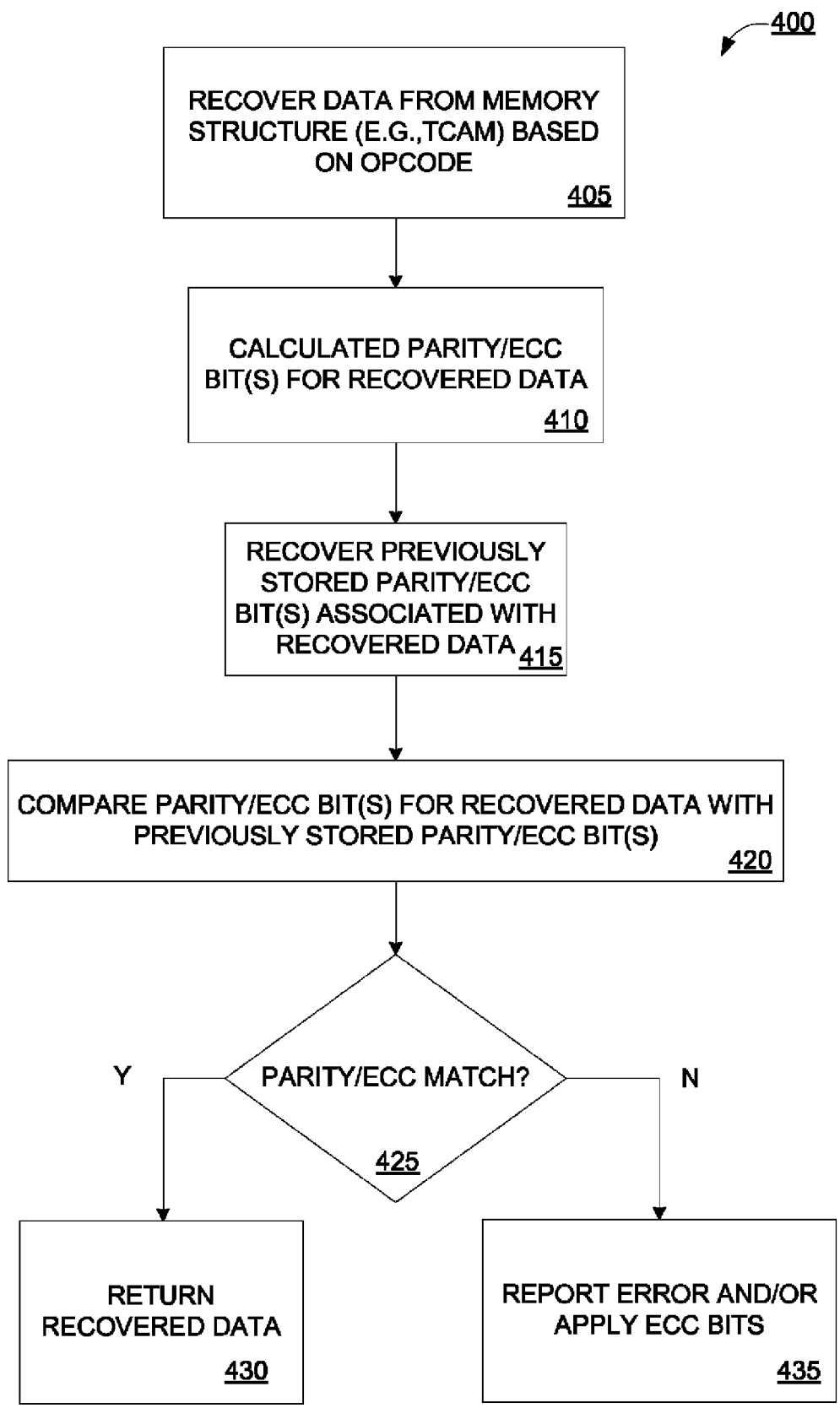
FIG. 4 is a flowchart illustrating an example method for performing a parity/ECC for a memory read operation.

FIG. 4 is a flowchart illustrating an example method 400 for performing a memory read operation. As with the methods 200 and 300, the method 400 may be implemented in the system 100 and will be described with further reference to FIG. 1. While the method 400 is described with particular reference to the system 100 in FIG. 1, it will be appreciated that the method 400 may be implemented in a number of other appropriate systems. For instance, the method 400 may be implemented in a system that includes fewer or additional components than the system illustrated in FIG. 1. As another alternative, the method 400 may be implemented in a system having a different arrangement or different elements than the system 100. The method 400 may also be implemented as block 220 of the method 200 illustrated in FIG. 2 when it is determined at block 215 of the method 200 that an opcode captured by the controller 130 is a memory read operation that is a parity/ECC protected operation (e.g., either in a protected address range or in an embodiment where all memory access operations are parity/ECC protected).

The method 400 may include, at block 405, recovering data from a previously written memory location in accordance with the captured memory read operation opcode. For instance, the controller 130 may issue the memory read operation to the bus ring 115 via the bus 120 and capture the associated data when it is returned to the bus 120 by the bus ring 115. The method 400 may further include the parity/ECC module 150 calculating a parity bit for the recovered data or determining ECC bits for the recovered data. The method 400 also may include, at block 415, recovering a previously stored parity bit or previously stored ECC bits associated with the recovered data from the parity/ECC table 165.

The method 400 may also include, at block 420, comparing the parity bit or ECC bits for the recovered data with the recovered parity bit or ECC bits, such as in the parity/ECC module 150. At block 425, the method 425 may include determining if the parity bits or ECC bits match based on the comparison at block 420. If the parity bits or ECC bits match, indicating no error has occurred, the method 400 may continue at block 430 and the recovered data may be returned in response to the memory operation requesting the data. However, in the event it is determined, at block 425, that the parity bits or the ECC bits do not match, the method 400 may continue at block 435 where an ECC repair is attempted and/or the error is reported if it is a parity error or the ECC repair is unsuccessful.

Figure 5:
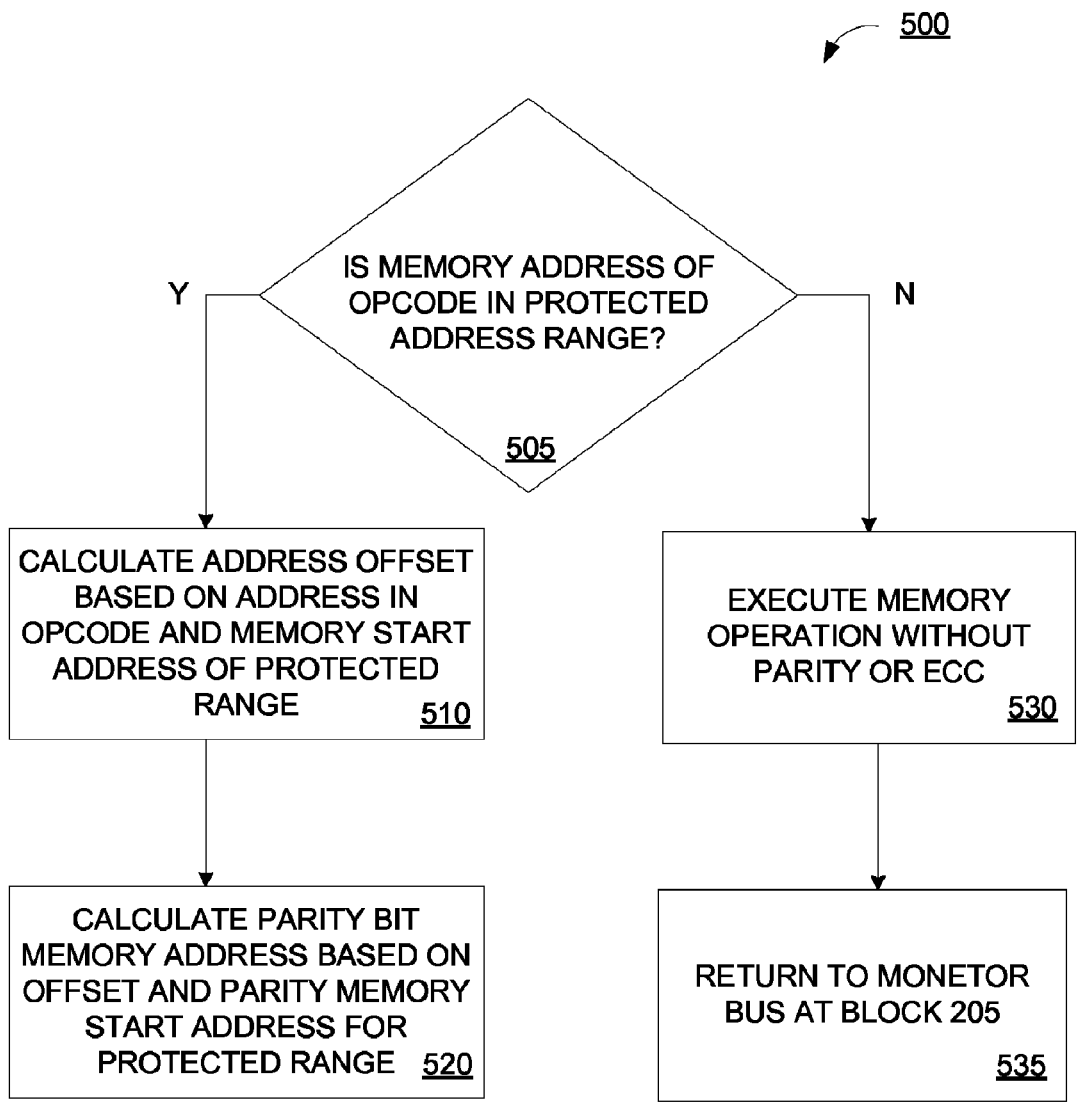
FIG. 5 is a flowchart illustrating an example method for determining a parity bit memory address for a memory address in a protected memory address range.

FIG. 5 is a flowchart illustrating an example method 500 for determining if an address associated with a memory access operation is a protected address and determining a parity bit address or an address for ECC bits, such as previously discussed. As with the methods 200, 300 and 400 the method 500 may be implemented in the system 100 and will be described with further reference to FIG. 1. While the method 500 is described with particular reference to the system 100 in FIG. 1, it will be appreciated that the method 500 may be implemented in a number of other appropriate systems. For instance, the method 500 may be implemented in a system that includes fewer or additional components than the system illustrated in FIG. 1. As another alternative, the method 500 may be implemented in a system having a different arrangement or different elements than the system 100.

The method 500 may also be implemented in conjunction with the method 200. For instance the method 500 may be implemented subsequent to the "YES" branch of block 215 and prior to block 220 of the method 200. In such an embodiment, the "YES" branch of block 505 may proceed to block 510, then block 520 of the method 500 and then to block 220 of the method 200. The "NO" branch of block 505 may proceed to block 530 and then to block 535 of the method 500. At block 535, the method 500 would return to monitoring the bus 120 at block 205 of the method 200.

At block 535, once it is determined than a captured opcode is a memory access operation, such as at block 215 of the method 200, the method 500 may include determining if an address associated with the memory access operation is a protected address. The determination at block 505 can be made using the techniques described above, such as by using the protected address range table 170. If it is determined at block 505, that the memory address associated with the captured opcode is a protected address, the method 500 may proceed to block 510.

At block 510, the parity/ECC engine 135 may calculate an address offset for a parity bit address or an address for ECC bits in the parity/ECC table 165 based on the address in the opcode and a start address of the associated protected address range that may be included, for example, in an associated memory map. For example, the offset may be determined by subtracting the start address for the protected address range from the address included in the captured opcode. The method 500 may then include, at block 520, calculating an address for the parity bit/ECC bits in the parity/ECC table 165 based on the offset determined at block 510 and a parity/ECC memory table start address associated with the protected address range determined at block 505. For example, the address for the parity bit/ECC bits in the parity/ECC table 165 may be determined by adding the offset and the parity/ECC memory start address.

If it is determined at block 505, that the memory address associated with the captured opcode is not a protected address, the method 500 may proceed to block 530 and execute the memory access operation (write or read) without parity or ECC protection. The method 500 may then proceed to block 535 and return to monitoring the bus 120 at block 205 of the method 200 illustrated in FIG. 2, in one example.

Figure 6:
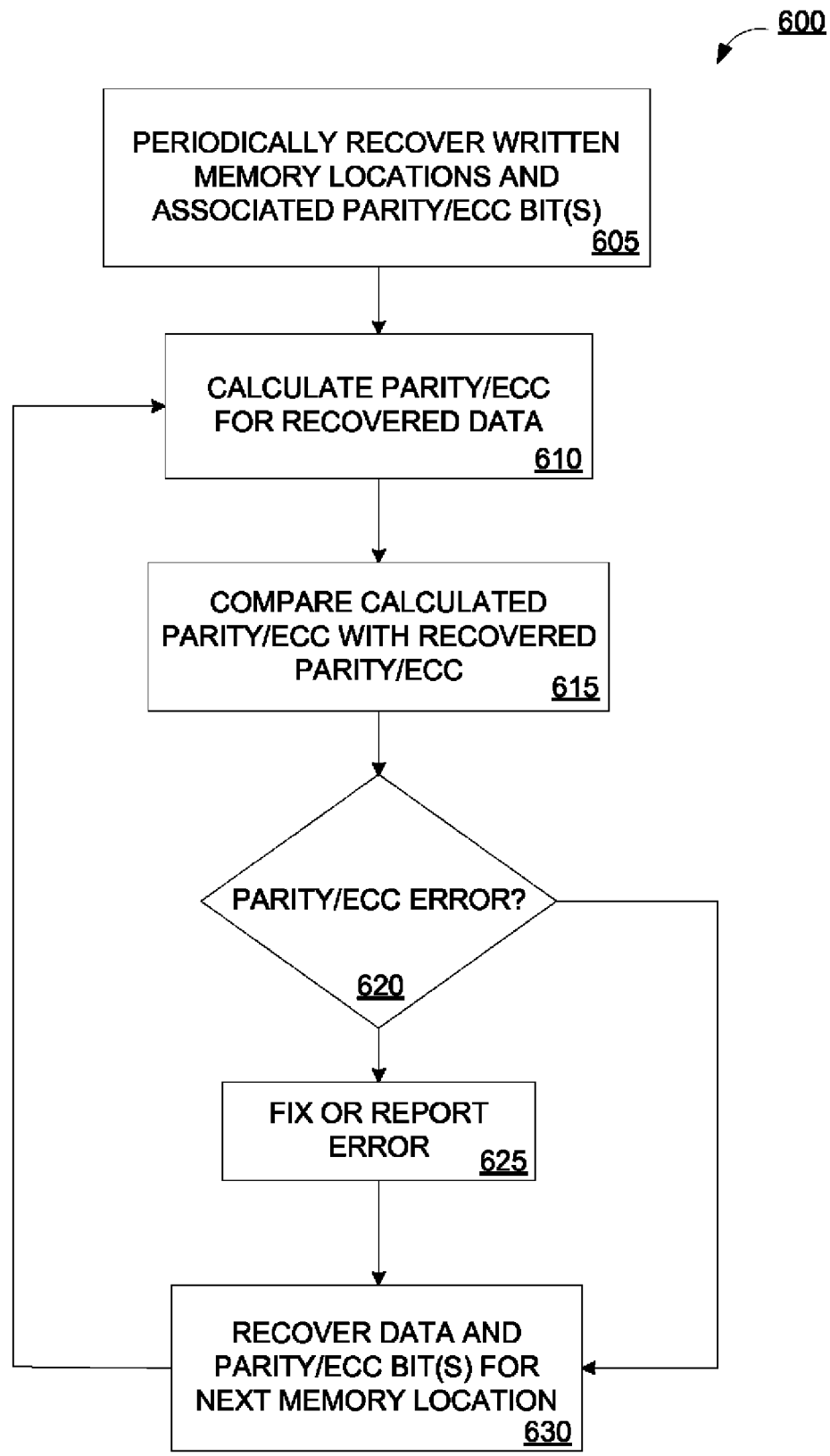
FIG. 6 is a flowchart illustrating an example method for periodically monitoring stored data for soft errors.

FIG. 6 is a flowchart illustrating an example method 600 for periodically monitoring stored data for soft errors. As with the methods 200, 300, 400 and 500, the method 600 may be implemented in the system 100 and will be described with further reference to FIG. 1. While the method 600 is described with particular reference to the system 100 in FIG. 1, it will be appreciated that the method 600 may be implemented in a number of other appropriate systems. For instance, the method 600 may be implemented in a system that includes fewer or additional components than the system illustrated in FIG. 1. As another alternative, the method 600 may be implemented in a system having a different arrangement or different elements than the system 100.

When implementing the method 600 (as well as the other methods described herein) in the system 100 illustrated in FIG. 1, the controller 130 may operate as a state machine. With particular reference to the method 600, at block 605, the controller 130 may cycle through previously written (parity or ECC) protected memory locations (such as defined in the protected address range table 170, for example) that contain valid data entries. In such an approach, the data stored at those protected memory locations, along with the associated parity bit or ECC bits stored in the parity/ECC table 165, are periodically recovered by the SER protection circuit 127.

After retrieving the previously written data from a particular protected memory location and its associated parity bit or ECC bits, the method 600 may include, at block 610, calculating/determining a parity bit or ECC bits for the recovered data. The method 600 may also include, at block 615, comparing the parity bit or ECC bits for the recovered data with the recovered previously written parity bit or ECC bits. At block 620, the method 600 may include determining if the parity bits or ECC bits match based on the comparison at block 615. If the parity bits or ECC bits match, indicating no error has occurred, the method 600 may continue at block 630 and the controller (state machine) 130 may recover the data and parity or ECC bits for a next protected memory location and then return to block 610 of the method 600.

However, in the event it is determined, at block 625, that the parity bits or the ECC bits do not match, the method 600 may continue to block 625 where an ECC repair is attempted and/or the error is reported, such as discussed above, if it is a parity error or the ECC repair is unsuccessful. The method 600 may then proceed from block 625 to block 630 and the controller 130 may retrieve the next protected location and the associated parity bit or ECC bits before returning to block 610 of the method 600.

Implementations of the various techniques described herein may be implemented in digital electronic circuitry, or in computer hardware, firmware, software, or in combinations of them. Implementations may implemented as a computer program product, i.e., a computer program tangibly embodied in an information carrier, e.g., in a machine-readable storage device, for execution by, or to control the operation of, data processing apparatus, e.g., a programmable processor, a computer, or multiple computers. A computer program, such as the computer program(s) described above, can be written in any form of programming language, including compiled or interpreted languages, and can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer may include at least one processor for executing instructions and one or more memory devices for storing instructions and data. Generally, a computer also may include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory may be supplemented by, or incorporated in special purpose logic circuitry.

To provide for interaction with a user, implementations may be implemented on a computer having a display device, e.g., a cathode ray tube (CRT) or liquid crystal display (LCD) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Implementations may be implemented in a computing system that includes a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components. Components may be interconnected by any form or medium of digital data communication, e.g., a communication network. Examples of communication networks include a local area network (LAN) and a wide area network (WAN), e.g., the Internet.

While certain features of the described implementations have been illustrated as described herein, many modifications, substitutions, changes and equivalents will now occur to those skilled in the art. It is, therefore, to be understood that the appended claims are intended to cover all such modifications and changes as fall within the true spirit of the embodiments of the invention.

What is claimed is:

1. An apparatus comprising:
   a controller configured to monitor a bus and capture operation codes (opcodes) transmitted over the bus, the bus being configured to transmit memory opcodes and non-memory opcodes;
   an opcode decoder operationally coupled with the controller, the opcode decoder being configured to determine if a captured opcode is a memory write operation or a memory read operation; and
   a parity module operationally coupled with the opcode decoder, the parity module being configured to:
      calculate a parity bit for data associated with the memory write operation;
      calculate a parity bit for data associated with the memory read operation;
      compare the calculated parity bit for the data associated with the memory read operation with a previously stored parity bit for the data associated with the memory read operation; and
      in the event the calculated parity bit for the data associated with the memory read operation and the previously stored parity bit for the data associated with the memory read operation do not match, provide at least one of a hardware parity error notification and a software parity error notification.

2. The apparatus of claim 1, further comprising a range decoder operationally coupled with the controller and the opcode decoder, the range decoder being configured to:
   determine whether a memory address associated with the memory write operation or the memory read operation is in a protected address range;
   in the event the memory address associated with the memory write operation or the memory read operation is in a protected address range, instruct the controller to execute the memory write operation or the memory read operation as a parity operation; and
   in the event the memory address associated with the memory write operation or the memory read operation is in a protected address range, instruct the controller to execute the memory write operation or the memory read operation as a non-parity operation.

3. The apparatus of claim 2, further comprising an address-range table that is operationally coupled with the range decoder, the address-range table being configured to store one or more memory address ranges and respective indications whether each of the one or more address ranges is a protected address range.

4. The apparatus of claim 1, further comprising an error entry address register configured to store a memory address of a memory location for which the parity module identifies a parity error.

5. The apparatus of claim 1, further comprising an error count register configured to:
   indicate to the apparatus that a parity error has occurred; and
   store a count of a number of parity errors that have occurred.

6. The apparatus of claim 1, further comprising a parity memory operationally coupled with the parity module and the opcode decoder, the parity memory being configured to:
   store the calculated parity bit for the data associated with the memory write operation; and retrieve the previously stored parity bit for the data associated with the memory read operation.

7. The apparatus of claim 6, wherein the parity memory comprises:
a parity memory controller operationally coupled with the parity module; and
a parity memory table operationally coupled with the parity memory controller, wherein the parity memory controller is configured to:
store, in the parity memory table, parity data provided by the parity module; and
retrieve, from the parity memory table, parity data requested by the parity module.

8. The apparatus of claim 6, further comprising:
a parity memory address register; and
a parity memory data register,
wherein the parity memory address register and the parity memory data register are configured to conduct direct memory access operations on the parity memory.

9. An apparatus comprising:
a controller configured to monitor a bus and capture operation codes (opcodes) transmitted over the bus, the bus being configured to transmit memory op-codes and non-memory opcodes;
an opcode decoder operationally coupled with the controller, the opcode decoder being configured to determine if a captured opcode is a memory write operation or a memory read operation; and
an error correction code (ECC) module operationally coupled with the opcode decoder, the ECC module being configured to:
determine a plurality of ECC bits for data associated with the memory write operation;
determine, based on a previously stored plurality of ECC bits for data associated with the memory read operation, whether an error has occurred in the data associated with the memory read operation; and
in the event it is determined that an error has occurred in the data associated with the memory read operation, perform a repair operation on the data associated with the memory read operation using the previously stored ECC bits.

10. The apparatus of claim 9, wherein, in the event the repair operation fails, the ECC module is further configured to provide at least one of a software ECC error indication and a hardware ECC error indication.

11. The apparatus of claim 9, further comprising an ECC memory operationally coupled with the ECC module, the ECC memory being configured to:
store the ECC bits for the data associated with the memory write operation;
retrieve the previously stored ECC bits for the data associated with the memory read operation.

12. A method comprising:
identifying a memory write operation code (opcode) for writing a data value, the memory write opcode being transmitted over a bus, the bus being configured to transmit memory opcodes and non-memory opcodes;
in response to identifying the memory write opcode:
calculating a parity bit for the data value;
writing the calculated parity bit to a parity table; and
writing the data value in a memory;
identifying a memory read opcode for reading the data value, the memory read opcode being transmitted over the bus; and
in response to identifying the memory read opcode:
retrieving the parity bit from the parity table;
retrieving the data value from the memory;
calculating a parity bit for the retrieved data value;
comparing the retrieved parity bit with the parity bit calculated for the retrieved data value; and
in the event the parity bit for the retrieved data value does not match the retrieved parity bit, providing at least one of a hardware parity error notification and a software parity error notification.

13. The method of claim 12, wherein providing the hardware parity error notification comprises setting a hardware interrupt flag.

14. The method of claim 12, wherein providing the hardware parity error notification comprises:
setting a hardware interrupt flag;
updating a parity error count register; and
writing a memory address corresponding with the retrieved data value in a fail address register.

15. The method of claim 12, wherein providing the software parity error notification comprises providing a negative software acknowledgement.

16. The method of claim 12, further comprising:
periodically retrieving the written data value and the written parity bit;
calculating a second parity bit for the retrieved data value;
comparing the second parity bit with the retrieved parity bit; and
in the event the second parity and the retrieved parity bit do not match, providing at least one of the hardware parity error notification and the software parity error notification.

17. The method of claim 12, further comprising:
determining if a memory address associated with the memory write opcode falls within one of one or more protected address ranges; and
in the event the memory address associated with the memory write opcode is not in one of the one or more protected address ranges, executing the memory write opcode as a non-parity memory operation.

18. The method of claim 17, further comprising:
in the event the memory address associated with the memory write opcode is determined to be in one of the one or more protected address ranges:
calculating an offset based on the memory address associated with the memory write opcode and a start address of the determined protected address range; and
calculating a parity bit memory address based on the offset and a parity memory start address corresponding with the determined protected address range.

19. The method of claim 18, wherein writing the calculated parity bit to the parity table comprises writing the calculated parity bit using the parity bit memory address.

20. The method of claim 17, wherein the one or more protected address ranges include an address range of a content addressable memory.

21. The method of claim 12, further comprising:
determining if a memory address associated with the memory read opcode falls within one of one or more protected address ranges; and
in the event the memory address associated with the memory read opcode is not in one of the one or more protected address ranges, executing the memory read opcode as a non-parity memory operation.

22. The method of claim 21, further comprising:
in the event the memory address associated with the memory read opcode is determined to be in one of the one or more protected address ranges:

calculating an offset based on the memory address associated with the memory read opcode and a start address of the determined protected address range; and calculating a parity bit memory address based on the offset and a parity memory start address corresponding with the determined protected address range.

23. The method of claim 22, wherein retrieving the parity bit from the parity table comprises retrieving the parity bit using the parity bit memory address.

* * * * *